United States Patent
Heer

[15] 3,706,128

[45] Dec. 19, 1972

[54] SURFACE BARRIER DIODE HAVING A HYPERSENSITIVE N REGION FORMING A HYPERSENSITIVE VOLTAGE VARIABLE CAPACITOR

[72] Inventor: John Heer, West Newbury, Mass.

[73] Assignee: Varian Associates, Palo Alto, Calif.

[22] Filed: June 30, 1970

[21] Appl. No.: 60,195

Related U.S. Application Data

[62] Division of Ser. No. 674,821, Oct. 12, 1967, Pat. No. 3,579,278.

[52] U.S. Cl. ........................29/578, 148/187, 29/589

[51] Int. Cl. ..............................................B01j 17/00

[58] Field of Search............317/234 U; 148/187, 1.5; 29/589, 578

[56] References Cited

UNITED STATES PATENTS

| | | | |
|---|---|---|---|
| 2,914,715 | 11/1959 | Uhlir | 317/234 |
| 3,450,957 | 6/1909 | Saxena et al. | 317/235 |

OTHER PUBLICATIONS

"Integrated Circuits," Motorola Series in Solid-State Electronics, R.M. Warner, Editor, copyright 1965, pages 304 and 305.

*Primary Examiner*—John F. Campbell
*Assistant Examiner*—W. Tupman
*Attorney*—William J. Nolan and Leon F. Herbert

[57] ABSTRACT

A method of making a surface barrier diode, also known as a Schottky diode, having a hypersensitive voltage variable capacitance, is disclosed. The surface barrier diode structure comprises a silicon wafer of $n^+$ conductivity having an n-type epitaxial layer which is oxidized on its outer surface to form a silicon oxide layer overlaying the epitaxial n-region of the wafer. The silicon oxide coating is relatively thin, as of less than 5000 A, and is formed relatively quickly, i.e., in less than 20 minutes at a temperature within the range of 1150° to 1250° C in order to produce a hypersensitive $n^+$ impurity accumulation layer immediately adjacent to and underlying the oxide coating. A hole is then opened through the silicon oxide layer and a metal electrode, as of chromium, is deposited directly upon the hypersensitive $n^+$ region to form the rectifying junction of the diode. The surface barrier diode (Schottky diode) exhibits a hypersensitive voltage variable capacitance effect where "hypersensitive voltage variable capacitance" means that the capacitance is approximately inversely proportional to the first power of the applied voltage as contrasted with normal voltage variable capacitance effects in PN junction devices wherein the capacitance is approximately inversely proportional to the ½ or ⅓ power of the applied voltage.

2 Claims, 7 Drawing Figures

SURFACE BARRIER DIODE HAVING A HYPERSENSITIVE N REGION FORMING A HYPERSENSITIVE VOLTAGE VARIABLE CAPACITOR

DESCRIPTION OF THE PRIOR ART

This is a division of application Ser. No. 674,821 filed Oct. 12, 1967 now U.S. Pat. No. 3,579,278.

Heretofore, surface barrier diodes have been fabricated by oxidizing an n-type epitaxial surface of a silicon wafer. The oxidized surface is then opened to expose the epitaxial layer and a metal contact is deposited upon the n-region of the exposed epitaxial surface. Such a diode is described in U.S. Pat. No. 3,290,127 issued Dec. 6, 1966. However, in the fabrication of this prior art surface barrier diode, the oxide layer was formed under conditions of temperature and time such that a hypersensitive $n^+$ region was not formed immediately below the silicon oxide layer, therefore, the diode exhibited the normal voltage variable capacitance effect.

Hypersensitive voltage variable capacitor diodes have been formed by diffusion techniques. In such devices, a PN junction is formed on an n-type silicon wafer. The n-region of the silicon wafer, which is immediately adjacent the P-region, is doped by diffusion in such a manner that an extremely thin hypersensitive $n^+$ layer is produced at the junction. Such a device has exhibited hypersensitive voltage variable capacitance effects but is relatively difficult to fabricate in practice due to the complexity of the diffusion technique. Such a hypersensitive voltage variable capacitance diode is described in an article titled "Hypersensitive Voltage Variable Capacitor" appearing in the March 1960 issue of Semiconductor Products at p. 56. A similar PN type diode exhibiting hypersensitive voltage variable capacitance effects is described in U. S. Pat. No. 3,149,395 issued Sept. 22, 1964.

SUMMARY OF THE PRESENT INVENTION

The principal object of the present invention resides in a method of making a surface barrier diode exhibiting hypersensitive voltage variable capacitance effects.

One feature of the present invention is a method of manufacturing a surface diode having a hypersensitive $n^+$ region formed immediately adjacent to and underlying the metal layer of the surface barrier diode, whereby the surface barrier diode is caused to exhibit hypersensitive voltage variable capacitance effects.

Another feature of the present invention is the same as the preceding feature wherein the hypersensitive $n^+$ region is formed in the silicon wafer by oxidizing the surface of the wafer in such a manner as to cause the hypersensitive $n^+$ region to be formed by an impurity accumulation effect immediately adjacent to and underlying the silicon oxide layer, whereby the hypersensitive $n^+$ region is easily formed in production.

Another feature of the present invention is the same as the preceding feature wherein the silicon oxide layer has a hole opened therethrough to the hypersensitive $n^+$ region and the metal layer is deposited directly upon the $n^+$ region, in surface barrier relation, to form the rectifying junction of the diode.

Another feature of the present invention is the same as the preceding feature wherein the silicon oxide layer is relatively thin, i.e., less than 5000 A thick and is formed at a temperature within the range of 1150° to 1250° C for less than 20 minutes.

Other features and advantages of the present invention will become apparent upon a perusal of the following specification taken in connection with the accompanying drawings wherein:

DESCRIPTION OF THE PREFERRED EMBODIMENTS

Figures 1A, 1B, 1C, 1D, 1E, 1F:
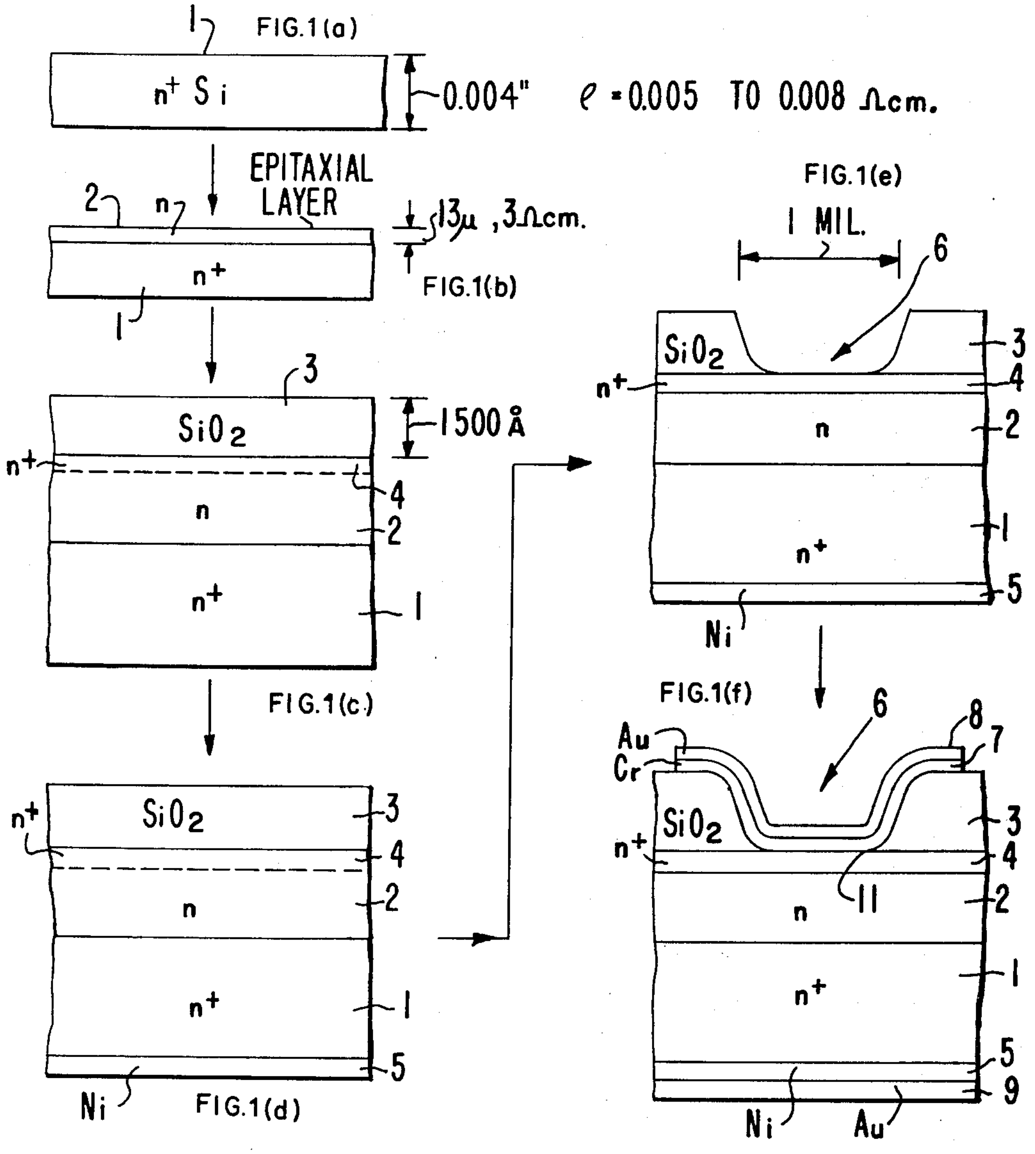
FIG. 1 (*a–f*) is a schematic step-by-step process flow diagram depicting the process steps for fabricating a surface barrier diode incorporating features of the present invention.

Referring now to FIG. 1 there is shown, in a step-by-step manner, the process for fabricating a surface barrier diode incorporating features of the present invention. The process starts at (*a*) with a silicon wafer 1 of $n^+$ conductivity type as of 0.00 thick. A suitable resistivity for the $n^+$ silicon wafer is a resistivity within the range of 0.005 to 0.008 ohm centimeters. In step (*b*) an epitaxial n-type conductivity layer 2 of silicon is deposited upon one surface of the silicon wafer 1 to a thickness as of 13 microns thick. The epitaxial layer 2 has a substantially higher resistivity than that of the $n^+$ region. A suitable resistivity for the n layer 2 is 3 ohm centimeters.

In step (*c*) a silicon oxide layer 3 is formed on the epitaxial layer 2. The silicon oxide layer is formed to a thickness as of 1500 A and preferably less than 5000 A in such a manner as to produce, by an impurity accumulation effect, an extremely thin hypersensitive n region 4 immediately adjacent to and underlying the silicon oxide layer 3. The silicon oxide layer 3 is conveniently formed by passing steam over the surface of the epitaxial layer 2 at a temperature of 1200° C for 8 minutes. The thickness of the oxide layer is estimated to be approximately 1500 A and the silicon oxide layer has a characteristic metallic blue hue.

The silicon oxide layer 3, in order to produce the hypersensitive $n^+$ region 4, should preferably be formed relatively quickly as compared to prior methods for forming the silicon oxide layer on Schottky diodes. More specifically, it is preferred that the silicon oxide layer be formed within the temperature range of 1150° to 1250° C in a time less than 20 minutes. Otherwise, the $n^+$ region 4 will be too thick, due to the diffusion of the impurities with time, and the resultant layer 4 will not exhibit hypersensitive voltage variable capacitance effects.

In step (*d*), a nickel coating is plated onto the outer bottom surface of the wafer and sintered at 800° C for 3 minutes to form ohmic contact between the nickel layer 5 and the wafer.

In step (*e*), a hole 6 is opened through the silicon oxide layers 5 and 3, respectively, to expose the surface of the hypersensitive $n^+$ layer 4. The hole 6 is opened by conventional photoresist and etching methods which employ a hydrofluoric acid etch. The opening 6 preferably has a diameter as of approximately 1 mil.

In step (*f*), metal layers of chromium 7 and gold 8 are successively deposited, as by vacuum deposition, through the hole 6 directly onto the hypersensitive $n^+$ layer 4. In addition, another gold contact layer 9 is deposited on the nickel layer 5 on the bottom side of the wafer. The chromium layer 7, as deposited upon the hypersensitive layer 4, forms a rectifying junction 11 defining a diode structure. The chromium layer 7 is deposited in surface barrier relation upon the layer 4 such that the resultant device is a surface barrier diode which exhibits hypersensitive voltage variable capacitance effects. The gold layers 8 and 9 provide suitable electrode structures for applying operating potentials to the diode. The $n^+$ region 1 of the diode structure serves as a substrate member for the epitaxial layer 2 and in addition serves to reduce the series resistance of the diode structure.

Figure 2:
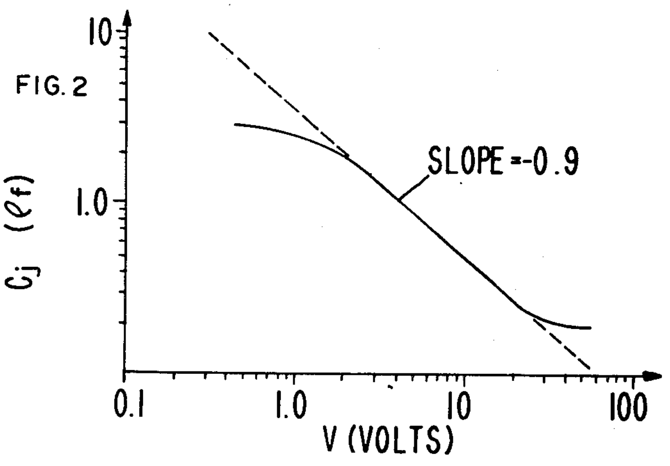
FIG. 2 is a plot of capacitance vs. voltage depicting the hypersensitive voltage variable capacitance effect of the diode of the present invention.

Referring now to FIG. 2 there is shown a plot of capacitance in picofarads vs. voltage in volts depicting the hypersensitive voltage variable capacitance effects of the surface barrier diode of the present invention. More specifically, the capacitance of the diode is seen to vary approximately inversely to the first power with the applied voltage over the voltage range from 2 volts to 20 volts. The hypersensitive voltage variable capacitance effect is due to the provision of the extremely thin hypersensitive $n^+$ region 4 which is formed directly below the rectifying junction 11. Conventional surface barrier diodes are formed in such a manner that the extremely thin and hypersensitive $n^+$ region 4 is not formed and such prior art diodes typically exhibit the conventional voltage variable capacitance effects wherein the capacitance is proportional to the minus ⅓ or minus ½ power of the applied voltage. Certain prior art PN-junction devices have exhibited hypersensitive voltage variable capacitance effects but such PN-devices are typically fabricated by diffusion techniques which are generally more difficult to control in production. Hypersensitive voltage variable semiconductor capacitors become important both as passive capacitors for electronic tuning, *afc*, and modulator applications and as active elements in diode parametric amplifiers and harmonic generators. The performance of such diodes is dependent upon the voltage sensitivity of the capacitance and, thus, the higher the capacitance sensitivity the less the control voltage required to obtain a desired change in capacitance.

Although the process steps, previously described with regard to FIG. 1, depict formation of only diode it is contemplated that, in production, the silicon wafer 1 will have lateral dimensions much larger than those desired for a single element so that, by subsequent slicing, many individual elements are made available. Typically, the wafer 1 can be 250 mils square.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. In the method of fabricating a surface barrier diode having hypersensitive voltage variable capacitance effects, the steps of, forming an oxide coating on a surface of an n-type silicon semiconductive water by oxidizing the surface of the silicon wafer at a temperature within the range of 1150° C to 1250° C for less than 20 minutes to cause a hypersensitive $n^+$ region to be formed by an impurity accumulation effect immediately adjacent to and underlying the oxide coating, opening a hole through the oxide coating to expose a surface of the hypersensitive $n^+$ region of the silicon wafer, and depositing a layer of metal on the exposed surface of the hypersensitive $n^+$ region in surface barrier relation therewith to form a rectifying junction of the diode.

2. The method in accordance with claim 1 wherein the oxide coating is formed to a thickness less than 5000 A.

* * * * *